United States Patent
Dasgupta

[19]

[11] Patent Number: 6,031,401
[45] Date of Patent: Feb. 29, 2000

[54] CLOCK WAVEFORM SYNTHESIZER

[75] Inventor: Uday Dasgupta, Singapore, Singapore

[73] Assignee: Tritech Microelectronics, Ltd., Singapore, Singapore

[21] Appl. No.: 09/092,581

[22] Filed: Jun. 8, 1998

[51] Int. Cl.[7] .................................................. H03K 3/017
[52] U.S. Cl. .......................... 327/116; 327/261; 327/122; 327/291; 327/299; 327/199
[58] Field of Search .................................... 327/105, 141, 327/261, 263, 271, 277, 284, 291, 407, 299, 116, 122, 199

[56] References Cited

U.S. PATENT DOCUMENTS

| | | | |
|---|---|---|---|
| 3,961,269 | 6/1976 | Alvarez, Jr. ............................. | 328/62 |
| 5,444,405 | 8/1995 | Truong et al. .......................... | 327/239 |
| 5,532,633 | 7/1996 | Kawai .................................... | 327/174 |
| 5,687,202 | 11/1997 | Eitrheim ................................. | 375/376 |
| 5,805,003 | 9/1998 | Hsu ....................................... | 327/270 |
| 5,894,213 | 4/1999 | Nakamura .............................. | 327/199 |

*Primary Examiner*—Dinh T. Le
*Attorney, Agent, or Firm*—George O. Saile; Stephen B. Ackerman; Billy J. Knowles

[57] ABSTRACT

A clock waveform synthesizer that will create a timing signal that is a multiple of the frequency of an master clock is disclosed and has the capability to programmably adjust the rising edges and falling edges of the synthesized waveform within the period of the master clocks. The clock waveform synthesizer has a multi-tapped delay line. The multi-tapped delay line will create replications of the master clock that are incrementally delayed from the master clock to create a plurality of delay signals. A fraction of the plurality of delay signals will be the inputs to each of a plurality of multiplexers. A select port on each of the multiplexers will receive a select signal to choose one delay signal of the fraction of the plurality of delay signals. The one selected delay signals will be the input to the set terminals and reset terminals of a plurality of edge-triggered set/reset flip-flops. The edge-triggered set/reset flip-flop has an output terminal which will transit from a first logic level to a second logic level when the one selected delay signals is received at the set terminal and will transit from the second logic level to the first logic level when the one selected delay signal is received at the reset terminal. The outputs of the plurality of edge-triggered set/reset flip-flops are connected to the inputs of a combining logic gate, which will combine the signals at the outputs of the edge-triggered set/reset flip-flops to form the synthesized timing signal.

22 Claims, 12 Drawing Sheets

CLOCK WAVEFORM SYNTHESIZER

BACKGROUND OF THE INVENTION

1. Field of the Invention

The present invention relates to electronic circuits that will convert a master clock signal to other timing signals. More particularly, the present invention relates to electronic circuits that will convert a master clock signal to timing signals having a frequency that is a multiple of the master clock frequency and has programmable placement of the rising and falling edges of the timing signals.

2. Description of Related Art

Clock synthesizers are well known in the art for generation of timing signals in electronic systems. A master clock or fundamental clock will be distributed within an electronic system. The master clock will then be multiplied by a factor to form a group of timing signals within a functional unit such as an integrated circuit. Often individual timing signals will have a requirement that the transition from a logical 0 to a logical 1 (a rising edge) or the transition from a logical 1 to a logical 0 (a falling edge) be located in time relative to the rising or falling edge of the master clock or to another of timing signal.

Microprocessors, for example often have two or more clock phases distributed within the circuitry of the microprocessor. A circuit such as a phase lock loop or delay locked loop is used to create the timing signals that are multiplied from the master clock. Delay or phase shift circuits will adjust the rising edge and falling edges relative to each other.

Phase locked loops and delay locked loops have notoriously long lock times to synchronize the master clock with the timing signals. Thus, if any of the timing signals need to be adjusted during operation, any programming of the timing circuits would introduce an inordinate latency to the changes. Further, any changes in latency would require increasing the complexity of the delay circuits, thus increasing any inherent error in the system.

U.S. Pat. No. 5,687,202 (Eitrheim) discloses a programmable phase shift clock generator having a phase comparator for generating a difference between an input clock signal and a feedback signal an up-down counter responsive to the phase comparator, for generating an n-bit count, a ring oscillator responsive to the up-down counter, for generating a loop clock signal as an output and as feedback to the phase comparator, and an adjustable delay line to provide a phase shifted clock signal from the loop clock output signal. A feature of Eitrheim is providing a digital signature of an input clock for further utilization in generating ancillary clock signals. A second feature is the ability to adjust precisely the duty cycle of an output clock independent of the input clock frequency.

U.S. Pat. No. 5,444,405 (Truong et al.) describes a system and method for providing programmable non-overlapping clock generation on a chip. The invention includes four main embodiments. The first embodiment is directed to the overall operation of an on-chip clock generator. The second embodiment is directed to a hardware programmable clock generation system and method. The third embodiment is directed to a software programmable clock generation system and method. The fourth embodiment is directed to a combination of all three embodiments.

The programmable on-chip clock generator provides two phases of a system clock with non-overlapping edges. The programmability of the clock generator provides flexibility during chip fabrication, and during functioning in an operational environment.

During the manufacturing phases of chip production, characteristics of the on-chip clock generator are altered to ensure the edges of the two generated clock do not overlap. This allows the manufacturer to optimize the performance of the chip, while the chip is undergoing initial production testing. This feature obviates the need to perform costly and time consuming trial-and-error design and redesign of on-chip clock generators.

Additionally, Truong et al. provides a technique for optimizing the performance of the on-chip clock generator after the chips have left the manufacturing environment. One feature of Truong et al. is the ability to adjust clock generation dynamically to account for climatic changes in an operational, or other post-production, environment. This allows chips to be manufactured with wider tolerances and allows operation of the chip to be optimized when the chip is in the operational environment. Adjustments to the on-chip clock generator during the manufacturing phase are referred to as hardware programming because the manufacturer alters the physical composition of the clock generator. Adjustments to the on-chip clock generator once the chip is fabricated and in the operational environment are referred to as software programming. This terminology reflects the fact that using software commands, the characteristics of the on-chip clock generator can be adjusted to compensate for changes in the operating environment. Programming capability in both cases is accomplished by adding or subtracting delay elements in feedback paths within the clock generator circuit.

SUMMARY OF THE INVENTION

An object of this invention is to provide timing signals that are multiples of the frequency of a master clock or fundamental waveform.

Another object of this invention is to provide timing signals with programmable relative delay times between the transitions between a first logic level and a second logic level or between the second logic and the first logic level of separate timing signals.

Still another object of this invention is to provide timing signals with programmable pulse widths of individual timing signals to adjust the duty cycle of the individual timing signals.

To accomplish these and other objects, a clock waveform synthesizer has a multi-tapped delay line. The multi-tapped delay line has an input to receive the fundamental waveform. Replications of the fundamental waveform will be incrementally increasingly delayed from the fundamental waveform to create a plurality of delay signals. A fraction of the plurality of delay signals will be the inputs to each of a plurality of multiplexers. A select port on each of the multiplexers will receive a select signal to choose one delay signal of the fraction of the plurality of delay signals. The one selected delay signal will be placed at an output port to transmit the one selected delay signal.

The clock waveform synthesizer, further, has a plurality of edge-triggered set/reset flip-flops. Each edge-triggered set/reset flip-flop has a set terminal connected to the output port of one multiplexer of the plurality of multiplexers to receive one of the selected delay signals, a reset terminal connected to the output port of a second multiplexer of the plurality of multiplexers to receive the one selected delay signal of the second multiplexer. The edge-triggered set/reset flip-flop has an output terminal which will transit from a first logic level to a second logic level when the one selected delay signal of the one multiplexer is received at the set terminal and will transit from the second logic level to the first logic level when the one selected delay signal of the second multiplexer is received at the reset terminal. The outputs of the plurality of edge-triggered set/reset flip-flops are connected to the inputs of a combining logic gate. The combining logic gate will combine the signals at the outputs of the edge-triggered set/reset flip-flops to form the synthesized timing signal.

The number of the plurality of delay signals created in the multi-tapped delay line is determined by the formula:

$$S = 2^{m+1} \times n$$

where:

S is a the number of the plurality of delay signals, m is a number of binary digits of the select signal, and n is a multiplier of a frequency of the fundamental waveform.

The number of multiplexers in the plurality of multiplexers is twice the multiplier n of the frequency of the fundamental waveform. In addition, the number of delay signals in the plurality of delay signals that are the inputs to each of the multiplexers is determined by the formula:

$$F = \frac{S}{2n} = 2^m$$

where:

F is the fraction of the plurality of delay signals,

S is a total number of the plurality of delay signals, and n is the multiplier of the frequency of the fundamental waveform.

The number of the plurality of edge-triggered set/reset flip-flops is equal to the multiplier n of the frequency of the fundamental waveform.

Each edge-triggered set/reset flip-flop has a first data type latch. The first data type latch has a data input connected to a power supply voltage source, a clock input connected to the set terminal, a clear input, and a noninverting output port connected to the output terminal. The edge-triggered set/reset flip-flop also has a second data type latch. The second data type latch has a data input connected to the noninverting output port, a clock input connected to the reset terminal, a clear input, and an inverting output port connected to the clear input of the first data type latch. In addition, the edge-triggered set/reset flip-flop has a logic control circuit. The logic control circuit has an input connected to the noninverting output of the first data type latch, and an output connected to the clear input of the second data type latch.

The output terminal of the edge-triggered set/reset flip-flop will transit from the first logic level to the second logic level when the selected delay signal arrives at the set terminal and will transit from the second logic level to the first logic level when the selected delay signal arrives at the reset terminal.

BRIEF DESCRIPTION OF THE DRAWINGS

FIG. 4c is a timing diagram of the master clock and the outputs of the delay generator of FIG. 4a.

FIG. 5b is a timing diagram of the edge-triggered set/reset flip-flop of FIG. 5a.

DETAILED DESCRIPTION OF THE INVENTION

Figure 1:
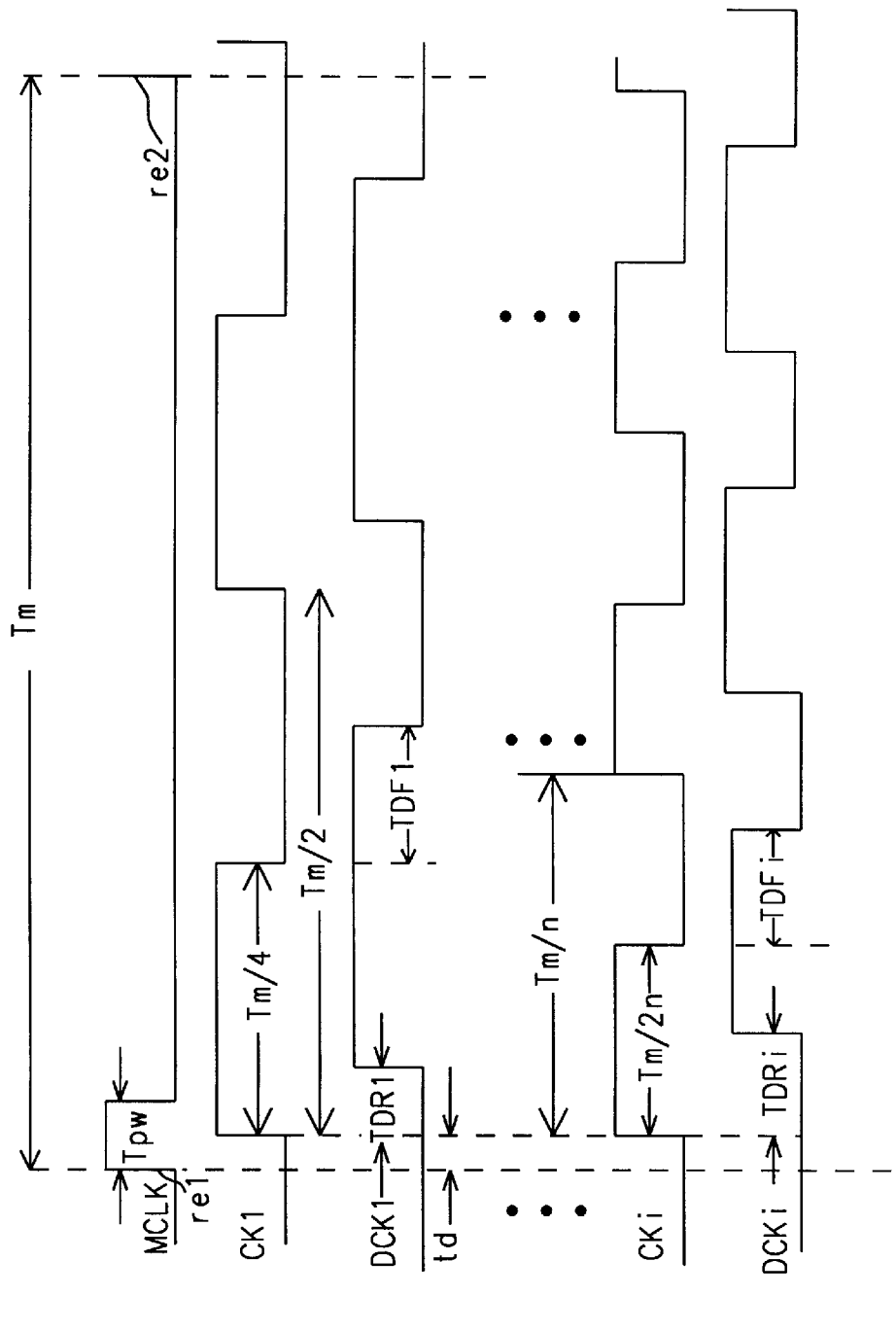
FIG. 1 is a timing diagram of the requirements for the inter-relationship of the clock waveforms of this invention.

Refer now to FIG. 1 to understand the fundamental requirements of the clock waveform synthesizer of this invention. The master clock MCLK provides the fundamental timing signal. The time period $T_m$ of the master clock MCLK is determined by the requirements of the overall electronic system. Further, the pulse width $t_{pw}$ and consequently, the duty cycle of the master clock MCLK will be determined by the overall system requirements. The structure of the circuitry that will create the master clock MCLK will precisely generate the master clock MCLK such that the period $T_m$ of the master clock MCLK, and thus the locations in time of the occurrences in time of the rising edges re1 and re2 are precisely controlled.

However, certain subsystems of electronic systems on individual semiconductor chips require timing signals CK1, ..., CKi to have frequencies that are multiples (n) of the master clock MCLK. Thus, if the timing signal CK1 is to two times the frequency of the master clock, the period $T_m/2$ is one half the period $T_m$ of the master clock MCLK.

A generalized case for the timing signal is shown for the timing signal CKi. The frequency of the timing signal CKi will be multiplied by the factor n, such that the period becomes $T_m/n$.

A further requirement is that the timing signals CK1, ..., CKi have a 50% duty cycle. This means that the pulse width will $T_m/4$ for the timing signal CK1 or generally, the pulse width will be $T_m/2n$ for the timing signal CKi.

A second set of timing signals DCK1, ..., DCKi may be required for the subsystem. The rising edges (transition from a logical 0 to a logical 1) of the timing signals DCK1, ..., DCKi will have a rising edge delay factor $TDR_1, ..., TDR_i$ respectively from the rising edges of the timing signals CK1, ..., CKi. Similarly, the falling edges (transition from a logical 1 to a logical 0) of the timing signals DCK1, ..., DCKi will have a falling edge delay factor $TDF_1, ..., TDF_i$ respectively from the rising edges of the timing signals CK1, ..., CKi.

Further, the rising edge and falling edge delay factors $TDR_1, ..., TDR_i$ and $TDF_1, ..., TDF_i$ need to be selected by programming with a binary number. The delay $t_d$ of the internal signals CK1, ..., CKi from the master clock MCLK is generally not specified.

As is apparent in FIG. 1, the clock waveform synthesizer of this invention particularly must be able to multiply the frequency of the master clock MCLK to create the frequency of the timing signals CK1, ..., CKi and DCK1, ..., DCKi and to adjust the relative delay factors of the rising edge and falling edge delay factors $TDR_1, \ldots, TDR_i$ and $TDF_1, \ldots, TDF_i$. The duty cycle of the timing signals CK1, ..., CKi and DCK1, ..., DCKi are determined by the relationships of the placement of the falling edge delay factors $TDF_1, \ldots, TDF_i$ with respect to the placement of the rising edge delay factors $TDR_1, \ldots, TDR_i$.

Figure 2A:
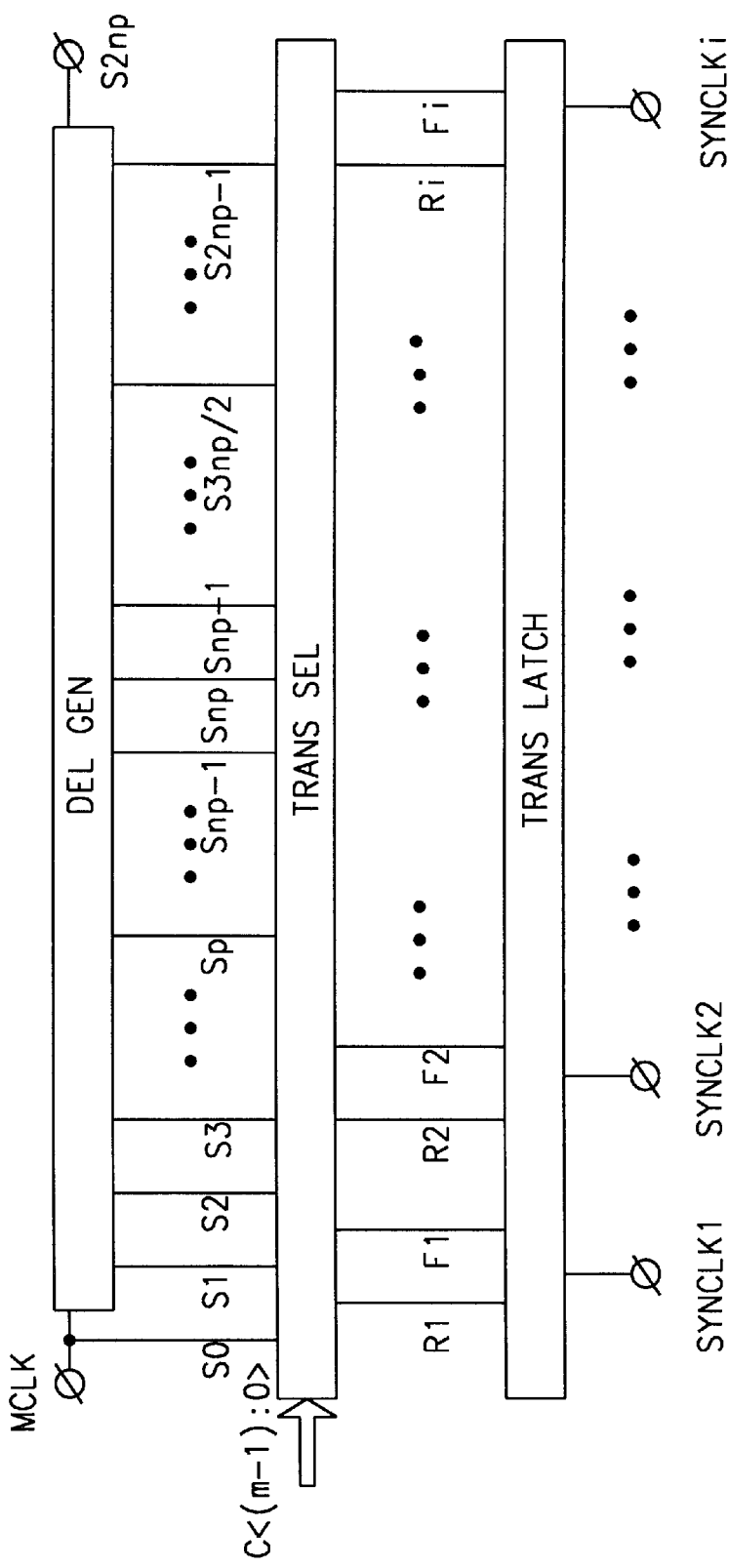
FIG. 2a is a block diagram of the functions of the clock waveform synthesizer of this invention.
Figure 2B:
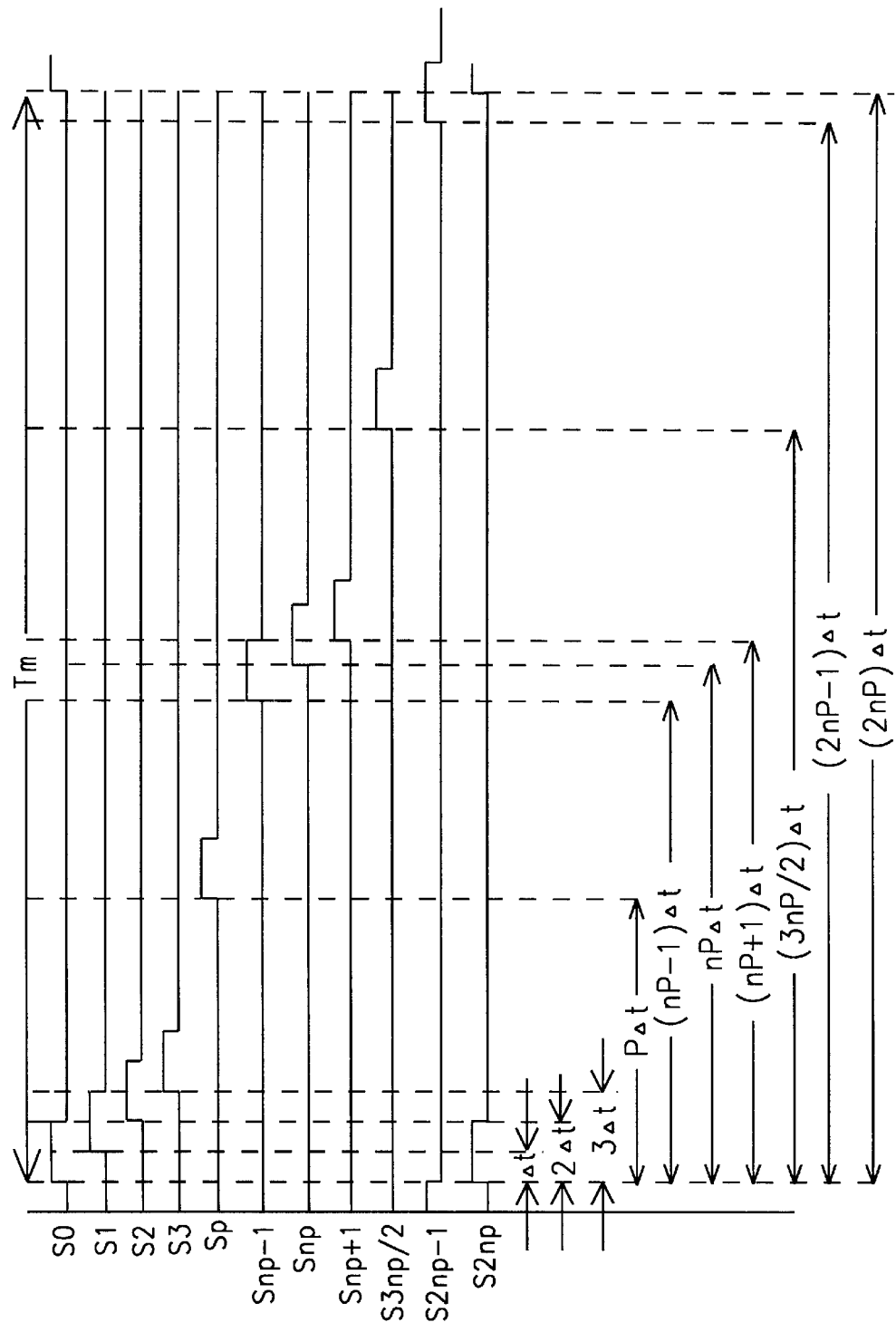
FIG. 2b is a timing diagram illustrating the timing relationships of the outputs of the delay generator of FIG. 2a of this invention.
Figure 2C:
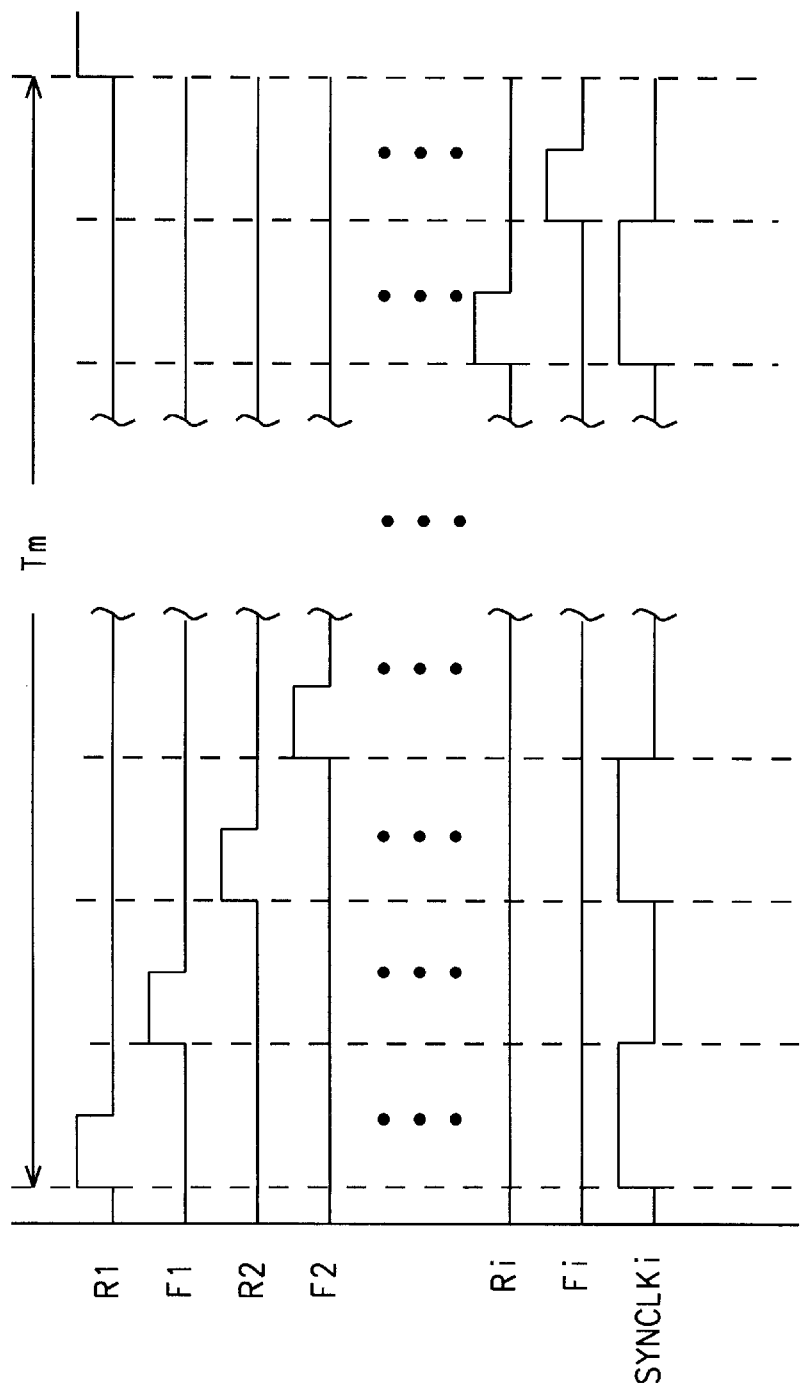
FIG. 2c is a timing diagram illustrating the timing relationships of the outputs of the transition latches of FIG. 2a of this invention.

Refer now to FIGS. 2a, 2b, and 2c, to understand the general structure of clock waveform synthesizer of this invention and how the general structure achieves the requirements outlined in FIG. 1 independent of duty cycle of the master clock MCLK. The master clock MCLK is the input to the delay generator DEL GEN. The delay generator DEL GEN will incrementally delay the master clock MCLK to form a series of waveforms $S_0, S_1, S_2, S_3, \ldots, S_P, \ldots, S_{nP-1}, S_{nP}, S_{nP+1}, \ldots, S_{3nP/2}, \ldots,$ and $S_{2np-1}$ as shown in FIG. 2b. Each waveform in the sequence is delayed from its preceding waveform by an incremental delay factor $\Delta T$. The time for each delay factor $\Delta T$ is calculated by the following formula:

$$\Delta T = \frac{T_m}{2nP}$$

where:
  $T_m$ is the period of the master clock MCLK,
  n is the multiplying factor of the frequency of the master clock MCLK,
  P is $2^m$ increments of the selector code C<m–1:0> indicating which of the series of delayed waveforms $S_0, S_1, S_2, S_3, \ldots, S_P, \ldots, S_{nP-1}, S_{nP}, S_{nP+1}, \ldots, S_{3nP/2}, \ldots,$ and $S_{2np-1}$ to be chosen.

The delayed waveforms $S_0, S_1, S_2, S_3, \ldots, S_P, \ldots, S_{nP-1}, S_{nP}, S_{nP+1}, \ldots, S_{3nP/2}, \ldots,$ and $S_{2np-1}$ will be the inputs to the transition selector TRANS SEL. The transition selector TRANS SEL will designate which of the rising edges of the series of waveforms will align with the appropriate transitions of the desired waveform. The selector code C<m–1:0> is a set of m-bit binary numbers indicating the placement of the transitions of the synthesized clocks $SYNCLK_1, SYNCLK_2, \ldots, SYNCLK_i$. The selector code C<m–1:0> consists of as many pairs of the m-bit binary numbers as the number of clocks to be synthesized. Each such pair consists of a number $CF_i$ to determine the falling edge delay $TDF_i$ of FIG. 1 and other number $CR_i$ to determine the rising edge delay $TDR_i$ of FIG. 1 of the corresponding synthesized clock $SYNCLK_i$. This the numbers $CF_i$ and $CR_i$ can be individually represented as:

$$\left. \begin{array}{l} CF_1\langle m-1:0\rangle, CR_1\langle m-1:0\rangle \text{ for } SYNCLK_1, \\ CF_2\langle m-1:0\rangle, CR_2\langle m-1:0\rangle \text{ for } SYNCLK_2, \\ \vdots \\ CF_i\langle m-1:0\rangle, CR_i\langle m-1:0\rangle \text{ for } SYNCLK_1, \end{array} \right\} C\langle m-1:0\rangle$$

The rising edge signals $R_1, R_2, \ldots, R_i$ and the falling edge signals $F_1, F_2, \ldots, F_i$ will contain the controlling edge (rising edge or falling edge) of the master clock MCLK at the time designated by the selector code C<m–1:0>. The rising edge signals $R_1, R_2, \ldots, R_i$ and the falling edge signals $F_1, F_2, \ldots, F_i$ will be the inputs to the transition latch TRANS LATCH. The transition latch TRANS LATCH will be composed of multiple edge-riggered set/reset flip-flop hereinafter described. Concentrating now on FIG. 2c, one rising edge signal of the rising edge signals $R_1, R_2, \ldots, R_i$ will cause the output of one of the edge-triggered set/reset flip-flop to transit from a logical 0 to a logical 1, and one falling edge of the failing edge signals $F_1, F_2, \ldots, F_i$ will cause the output of the edge-triggered set/reset flipflop to transit from a logical 1 to a logical 0.

The number of edge-triggered set/reset flip-flops used to determine one of the synthesized clocks $SYNCLK_1, SYNCLK_2, \ldots, SYNCLK_i$ will be the multiplying factor n of the synthesized clock from the master clock MCLK. The outputs of the edge-triggered set/reset flip-flop will be logically combined to form the synthesized clocks $SYNCLK_1, SYNCLK_2, \ldots, SYNCLK_i$.

Figure 3:
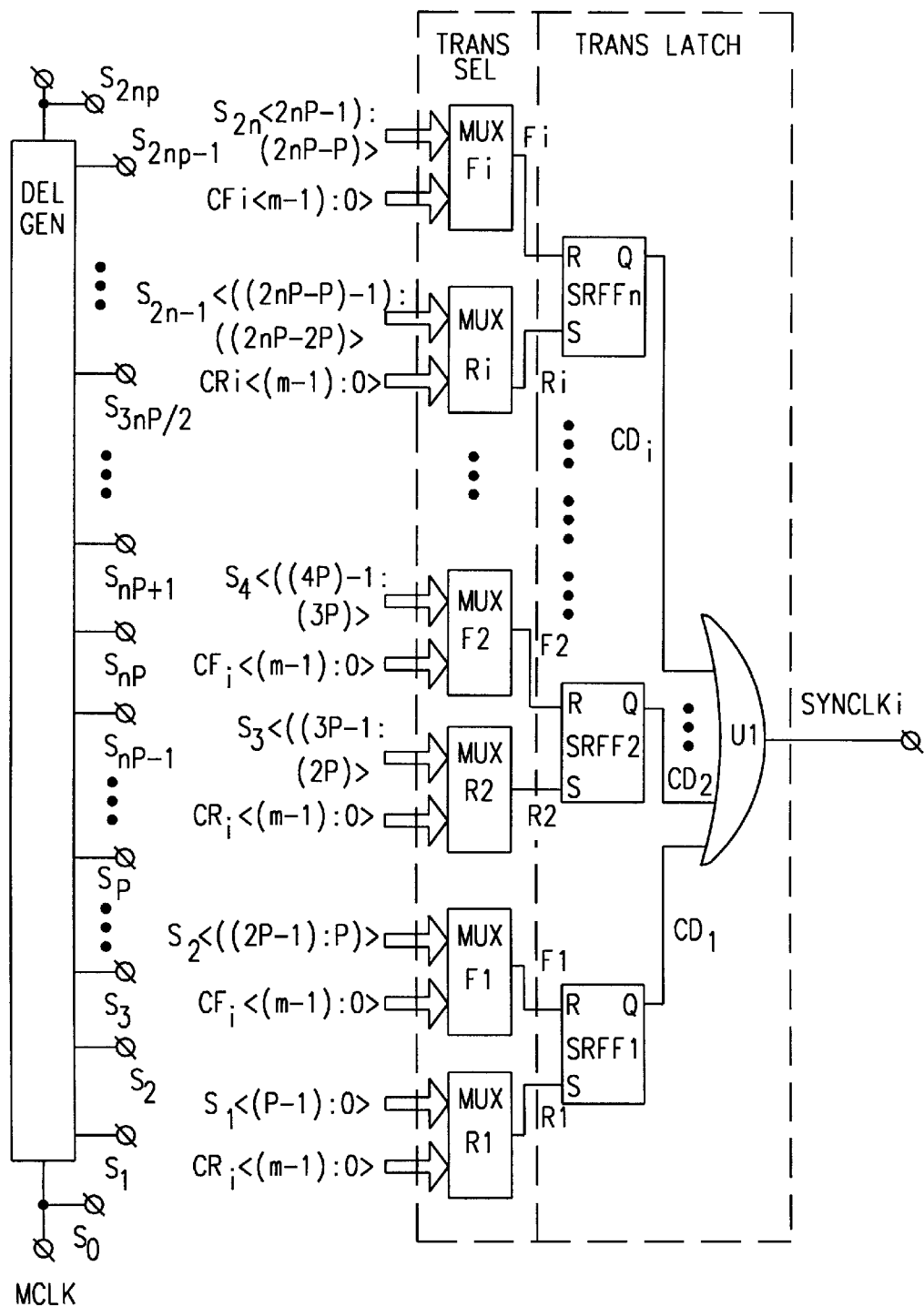
FIG. 3 is generalized schematic of the preferred embodiment of the clock waveform synthesizer of this invention.

A preferred embodiment of the waveform synthesizer is shown in FIG. 3. The delay generator DEL GEN will create the series of waveforms $S_0, S_1, S_2, S_3, \ldots, S_P, \ldots, S_{nP-1}, S_{nP}, S_{nP+1}, \ldots S_{3nP/2}, \ldots, S_{2np-1}$ and $S_{2np}$ from the master clock MCLK as described above. The transition selector TRANS SEL will be composed of multiple multiplexers MUXR1, MUXF1, MUXR2, MUXF2, MUXRi, and MUXFi. Each of the multiplexers MUXR1, MUXF1, MUXR2, MUXF2, ..., MUXRi, and MUXFi will have a number of inputs that is equal to the number of increments (P) of the selector codes. For instance if the selector codes $CF_i$<m–1:0> and $CR_i$<m–1:0> each have 8 bits then the number of increments (P) will be:

$$P=2^m=2^8=256.$$

The number of multiplexers MUXR1, MUXF1, MUXR2, MUXF2, ..., MUXRi, and MUXFi within the transition selector TRANS SEL will be double the multiplying factor n of the synthesized waveform $SYNCLK_i$. Each multiplexer MUXR1, MUXR2, ..., and MUXRi will determine the position within the period $T_m$ of the master clock MCLK of the rising edge of the synthesized clock $SYNCLK_i$. And each multiplexer MUXF1, MUXF2, ..., and MUXFi will determine the falling edges within the period $T_m$ of the master clock MCLK.

The selector codes $CF_i$<m–1:0> and $CR_i$<m–1:0> will be programmed to choose the appropriate delayed signal for each one of the multiplexers MUXR1, MUXF1, MUXR2, MUXF2, ..., MUXRi, and MUXFi. Thus, the outputs $R_1, F_1, R_2, F_2, \ldots, R_i, F_i,$ of the multiplexers MUXR1, MUXF1, MUXR2, MUXF2, ..., MUXRi, and MUXFi will have the rising edges of the selected delayed signal waveforms $S_0, S_1, S_2, S_3, \ldots, S_P, \ldots, S_{nP-1}, S_{nP}, S_{nP+1}, \ldots, S_{3nP/2}, \ldots, S_{2np-1}$ and $S_{2np}$ at the appropriate time of the desired transition of the synthesized clock $SYNCLK_i$.

The outputs $R_1, F_1, R_2, F_2, \ldots, R_i, F_i,$ of the multiplexers MUXR1, MUXF1, MUXR2, MUXF2, ..., MUXRi, and MUXFi will be pair-wise inputs to the transition latch TRANS LATCH. The transition latch TRANS LATCH will be composed of the edge-triggered set/reset flip-flops SRFF1, SRFF2, ..., SRFFi. The set inputs S of each of the edge-triggered set/reset flip-flops SRFF1, SRFF2, ..., SRFFi will be the outputs $R_1, R_2, \ldots, R_i$ from the multiplexers MUXR1, MUXR2, ..., MUXRi. The outputs $R_1, R_2, \ldots, R_i$ from the multiplexers MUXR1, MUXR2, ..., MUXRi will be selected to determine the locations in within the period $T_m$ of the rising edges of the synthesized clock $SYNCLK_i$. Likewise, the reset inputs R of the edge-triggered set/reset flip-flops SRFF1, SRFF2, ..., SRFFi will be the outputs $F_1, F_2, \ldots, F_i$ from the multiplexers MUXR1, MUXR2, ..., MUXRi. The outputs $F_1, F_2, \ldots, F_i$ from the multiplexers MUXF1, MUXF2, . . . , MUXFi will be selected to determine the locations in within the period $T_m$ of the falling edges of the synthesized clock $SYNCLK_i$.

The outputs $CD_1$, $CD_2$, . . . , $CD_i$ of the edge-triggered set/reset flip-flops SRFF1, SRFF2, . . . , SRFFi will be logically combined in the OR circuit U1 to form the synthesized clock $SYNCLK_i$.

The edge-triggered set/reset flip-flops SRFF1, SRFF2, . . . , SRFFi will operate as above described. The output Q of each edge-triggered set/reset flip-flops SRFF1, SRFF2, . . . , SRFFi will transit from a logical 0 to a logical 1 at the arrival of the rising edge signal $R_1$, $R_2$, . . . , $R_i$ from the multiplexers MUXR1, MUXR2, . . . , MUXRi. The output Q of each edge-triggered set/reset flip-flops SRFF1, SRFF2, . . . , SRFFi will transit from a logical 1 to a logical 0 at the arrival of the falling edge signal $F_1$, $F_2$, . . . , $F_i$ from the multiplexers MUXF1, MUXF2, . . . , MUXFi.

The rising edge delay factors $TDR_i$ and the falling edge delay factors $TDF_i$ of FIG. 1 are functions of the incremental delay factor $\Delta T$ of FIG. 2c. The rising edge delay factor $TDR_i$ is determined by the formula:

$$TDR_i = \Delta T \cdot |CR_i \langle m-1:0 \rangle| = \frac{T_m}{2nP} \cdot |CR_i \langle m-1:0 \rangle|$$

where:

$|CR_i \langle m-1:0 \rangle|$ is the decimal equivalent of the binary selector code $CR_i \langle m-1:0 \rangle$. This can range from 0 to $2^m-1$.

The falling edge delay factor $TDF_i$ is determined by the formula:

$$TDF_i = \Delta T \cdot |CF_i \langle m-1:0 \rangle| = \frac{T_m}{2nP} \cdot |CF_i \langle m-1:0 \rangle|$$

where:

$|CF_i \langle m-1:0 \rangle|$ is the decimal equivalent of the binary selector code $CF_i \langle m-1:0 \rangle$. This can range from 0 to $2^m-1$.

The selector codes $CF_i \langle m-1:0 \rangle$ and $CR_i \langle m-1:0 \rangle$ as shown have a single code each to generate a symmetrical synthesized clock $SYNCLK_i$. That is each cycle within the synthesized clock $SYNCLK_i$ will be identical. If the selector codes $CF_i \langle m-1:0 \rangle$ and $CR_i \langle m-1:0 \rangle$ to each of the multiplexers MUXR1, MUXF1, MUXR2, MUXF2, . . . , MUXRi, and MUXFi are different, each cycle within the synthesized clock $SYNCLK_i$ is no longer identical. This will allow adjustment of the relative timings of each rising and falling edge of the synthesized clock $SYNCLK_i$.

The waveform synthesizer as shown in FIGS. 2a and 3 allows the synthesis of any number of timing signals, wherein each timing signal is a multiple of the frequency of the master clock MCLK. Each timing signal has programmable rising and falling edges relative to the beginning of each cycle of the master clock MCLK and has a programmable duty cycle by adjusting the relative positions of the rising and falling edges of each timing signal.

Changing the frequency and relative positions of the rising and falling edges of the timing signals are accomplished dynamically. Since there is no analog feedback loop controlling the frequency or the relative positions of the rising and falling edges of the timing signals of the waveform synthesizer of this invention, there is no settling time to cause instability during adjustments to the frequency or the relative positions of the rising and falling edges of the timing signals.

Figure 4A:
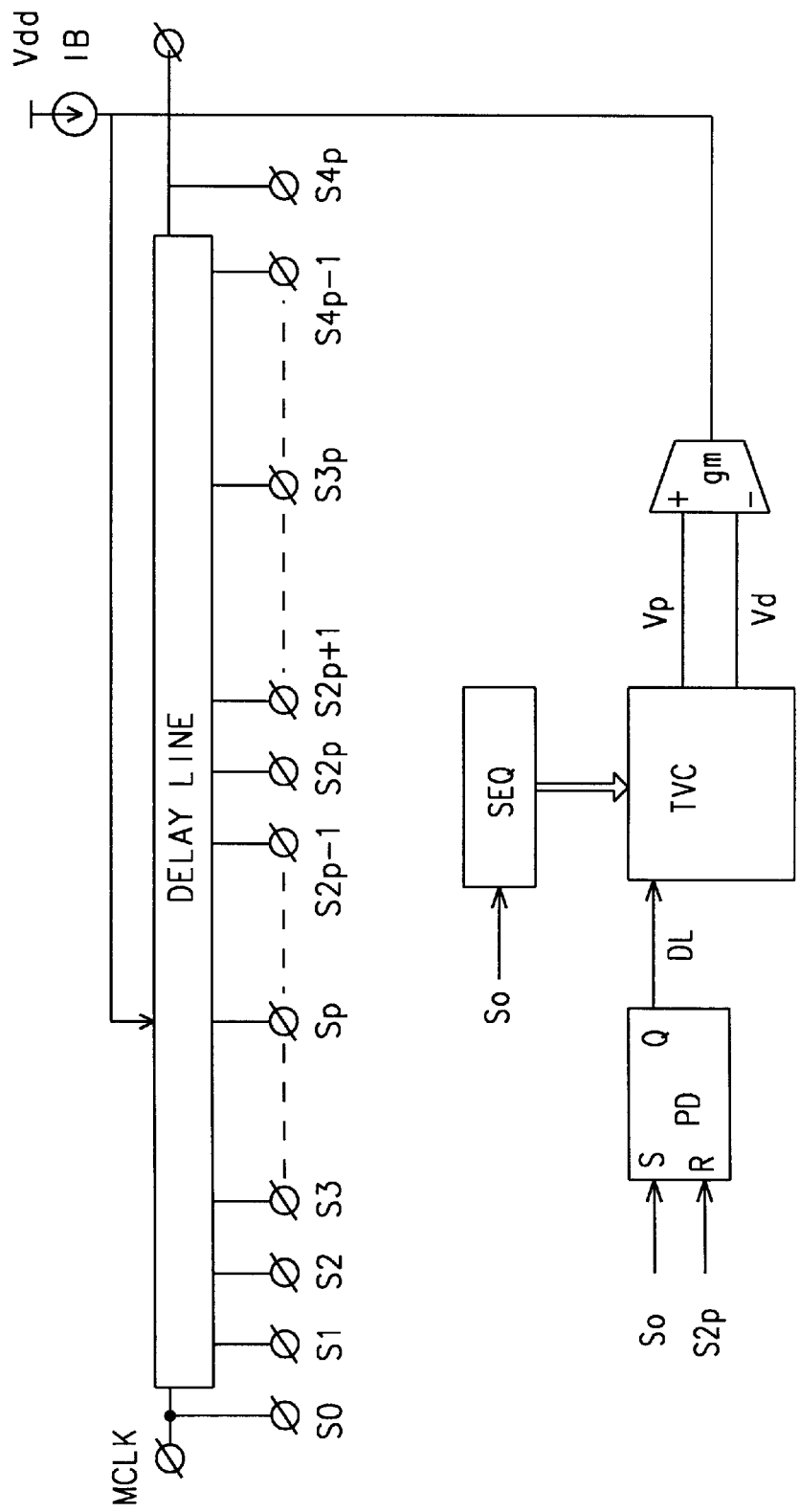
FIG. 4a is a schematic diagram of a delay generator of an implementation of a clock waveform synthesizer that doubles the master clock frequency of this invention.
Figure 4B:
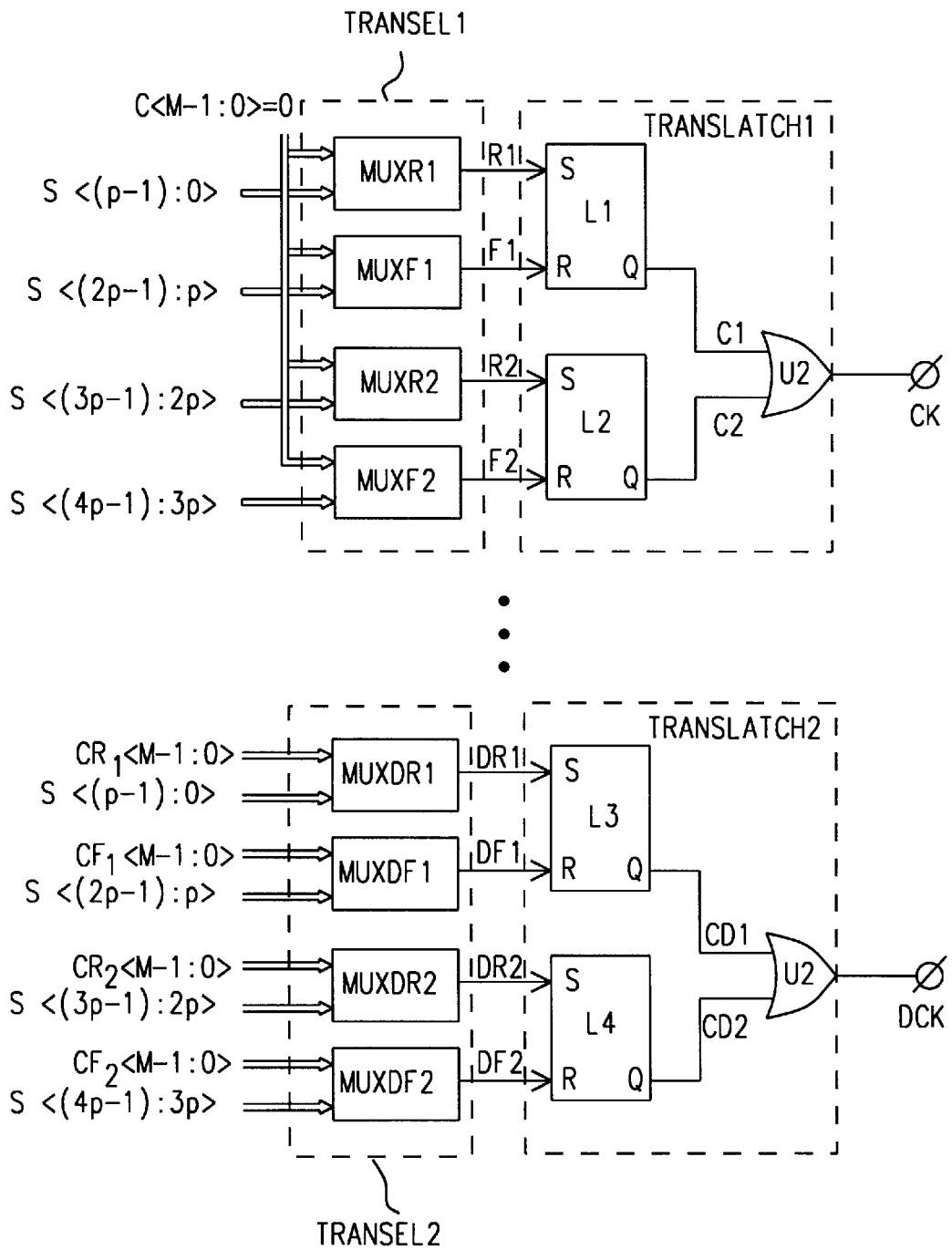
FIG. 4b is a schematic diagram of the transition selector and the transition latch of a clock waveform synthesizer that will double the frequency of the master clock of this invention.

An implementation of the preferred embodiment is illustrated in FIGS. 4a, 4b, 4c, 4d, and 4e. This implementation will provide two clock signals CK and DCK that are twice the frequency of the master clock MCLK and have relatively different rising edges and falling edges. The delay generator is shown in FIG. 4a and has a structure similar to that of U.S. patent application Ser. No. 08/966,736, filed Nov. 10, 1997, assigned to the same assignee as the present invention, and included herein by reference. The master clock MCLK is the input to the delay line. The delay line will incrementally delay the master clock to form the series of waveforms $S_0$, $S_1$, $S_2$, . . . , $S_P$, . . . , $S_{2P-1}$, $S_{2P}$, $S_{2P+1}$, . . . , $S_{3P}$, . . . , $S_{4p-1}$ and $S_{4p}$. Since the two clock signals CK and DCK are two be twice the frequency of the master clock MCLK, the factor n will be 2. Thus, again if the selector code is to be eight bits, then the number of taps on the delay line will be:

$$2nP = 2 \times 2 \times 2^8 = 1024$$

The phase difference detector PD, the sequencer SEQ, the time-to-voltage converter TVC, and the transconductance amplifier gm will appropriately adjust the timing increment $\Delta t$ to correct for any error. The phase difference detector 230a of FIG. 2a of the referenced application will be implemented as an edge-triggered set/reset flip-flop. The set input S of the edge-triggered set/reset flip-flop that is the phase difference detector PD is connected to the first delay signal $S_0$ from the delay line. The reset input R of the edge-triggered set/reset flip-flop is connected to the output $S_{2p}$ that is the midpoint tap of the delay line. The output Q of the edge-triggered set/reset flip-flop will indicate the actual difference in time between the first delay signal $S_0$ of the delay line and the midpoint delay $S_{2p}$. The delay difference DL will be compared in the time-to-voltage converter TVC against the output of the sequencer SEQ to form the phase correction signals Vp and VD. The phase correction signals are inputs to the phase correction circuit that is the transconductance amplifier gm. The transconductance amplifier gm will provide a correction signal to the current source $I_B$ to appropriately adjust the delay increment of the delay line.

Figure 4C:
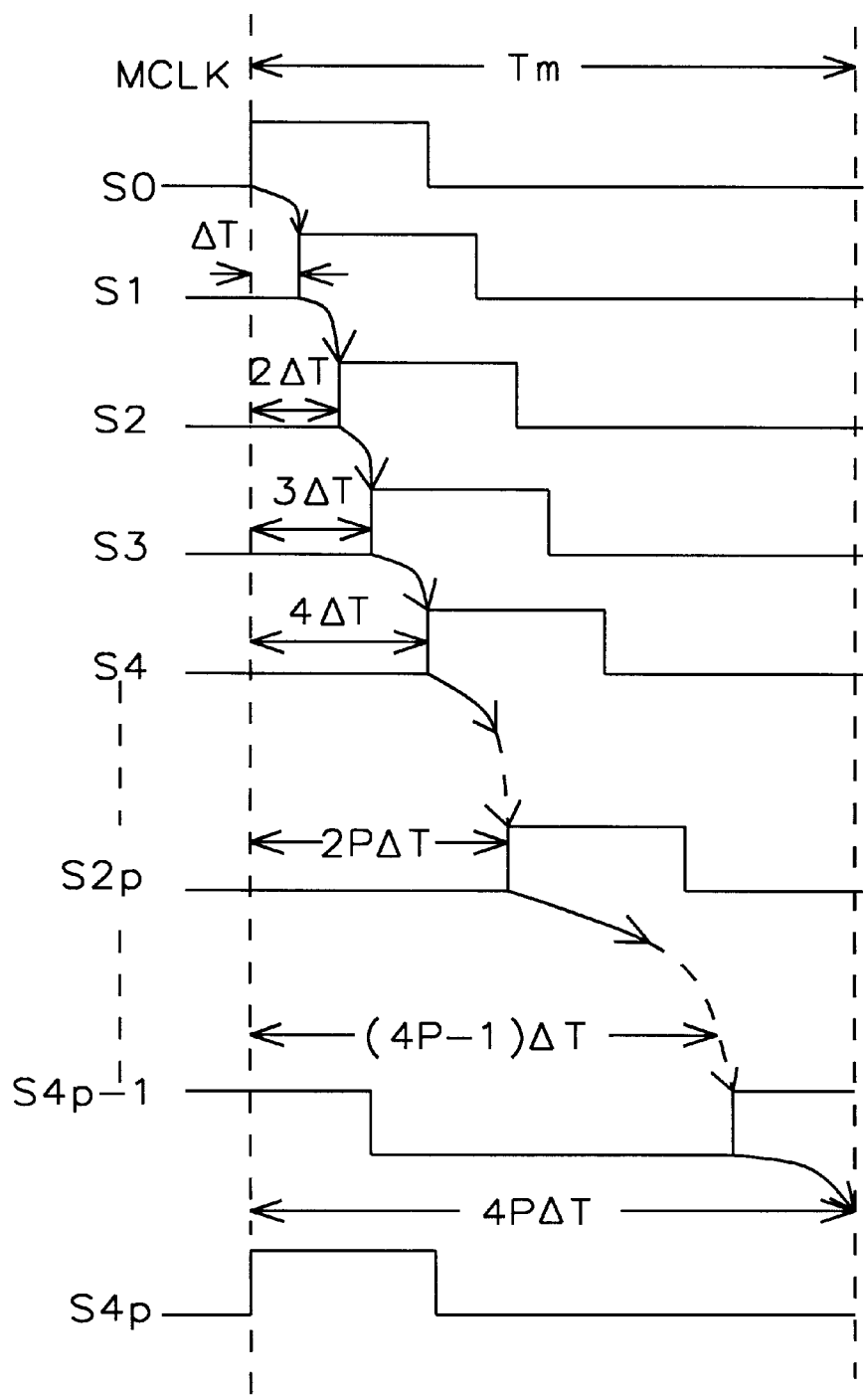

Refer now to FIG. 4c for a timing diagram of the delayed signals $S_0$, $S_1$, $S_2$, . . . , $S_P$, . . . , $S_{2P-1}$, $S_{2P}$, $S_{2P+1}$, . . . , $S_{3P}$, . . . , $S_{4p-1}$ and $S_{4p}$. Each delayed signal $S_0$, $S_1$, $S_2$, . . . , $S_P$, . . . , $S_{2P-1}$, $S_{2P}$, $S_{2P+1}$, $S_{3P}$, . . . , $S_{4p-1}$ and $S_{4p}$ will be incrementally delayed by the delay factor $\Delta T$ multiplied by the positional designator of the delay signal. For instance, the delayed signal $S_2$ will be delayed by the delay factor $2\Delta T$ from the master clock MCLK, the delay signal $S_3$ will be delayed by the delay factor $3\Delta T$ from the master clock MCLK, and the delayed signal $S_{4P-1}$ will be delayed by the delay factor $(4P-1)\Delta T$ from the master clock MCLK.

The transition selector TRANS SEL1 and the transition latch TRANS LATCH1 will create the clock CK. The series of the delayed signals $S_0$, $S_1$, $S_2$, . . . , $S_P$, . . . , $S_{2P-1}$, $S_{2P}$, $S_{2P+1}$, . . . , $S_{3P}$, . . . , $S_{4p-1}$ and $S_{4p}$ will be the input transition selector TRANS SEL1. The transition selector TRANS SEL1 will be comprised of the multiplexers MUXR1, MUXF1, MUXR2, and MUXF2. The series of delayed signals $S_0$ through $S_{P-1}$ will be the inputs $S_{11}$ to the multiplexer MUXR1, the delayed signals $S_P$ through $S_{2P-1}$ will be the inputs $S_{12}$ to the multiplexer MUXF1, the delayed signals $S_{2P}$ through $S_{3p-1}$ will be the inputs $S_{13}$ to the multiplexer MUXR2, and the delayed signals $S_{3p}$ through $S_{4p-1}$ will be the inputs $S_{14}$ to the multiplexer MUXF2.

The duty cycle of the clock CK is to be 50%. To set the transitions of the clock CK to the 50%, the selector code C<m−1:0> will be placed to a logical 0 to select the delayed waveforms $S_0$, $S_P$, $S_{2P}$, and $S_{3P}$ that will align with the transitions to make the duty cycle of the clock CK 50%.

The output of the multiplexer MUXR1 will be the signal R1 indicating the first rising edge of the clock CK. The output of the multiplexer MUXF1 is the signal F1 indicating the first falling edge of the clock CK. The output of the multiplexer MUXR2 is the signal R2 indicating the second rising edge of the clock CK. And the output of the multiplexer MUXF2 will be the signal F2 indicating the is second falling edge of the clock CK.

The signals R1 and F1 are respectively the set S and reset R inputs of the edge-triggered set/reset flip-flop L1 and the signals R2 and F2 are respectively the set S and reset R inputs of the edge-triggered set/reset flip-flop L2. The output Q of the edge-triggered set/reset flip-flop L1 forms the preliminary timing signal C1 and the output Q of the edge-triggered set/reset flip-flop L2 forms the preliminary timing signal C2. The logic gate U1 will logically combine (OR) the preliminary timing signals C1 and C2 to form the clock CK.

Figure 4D:
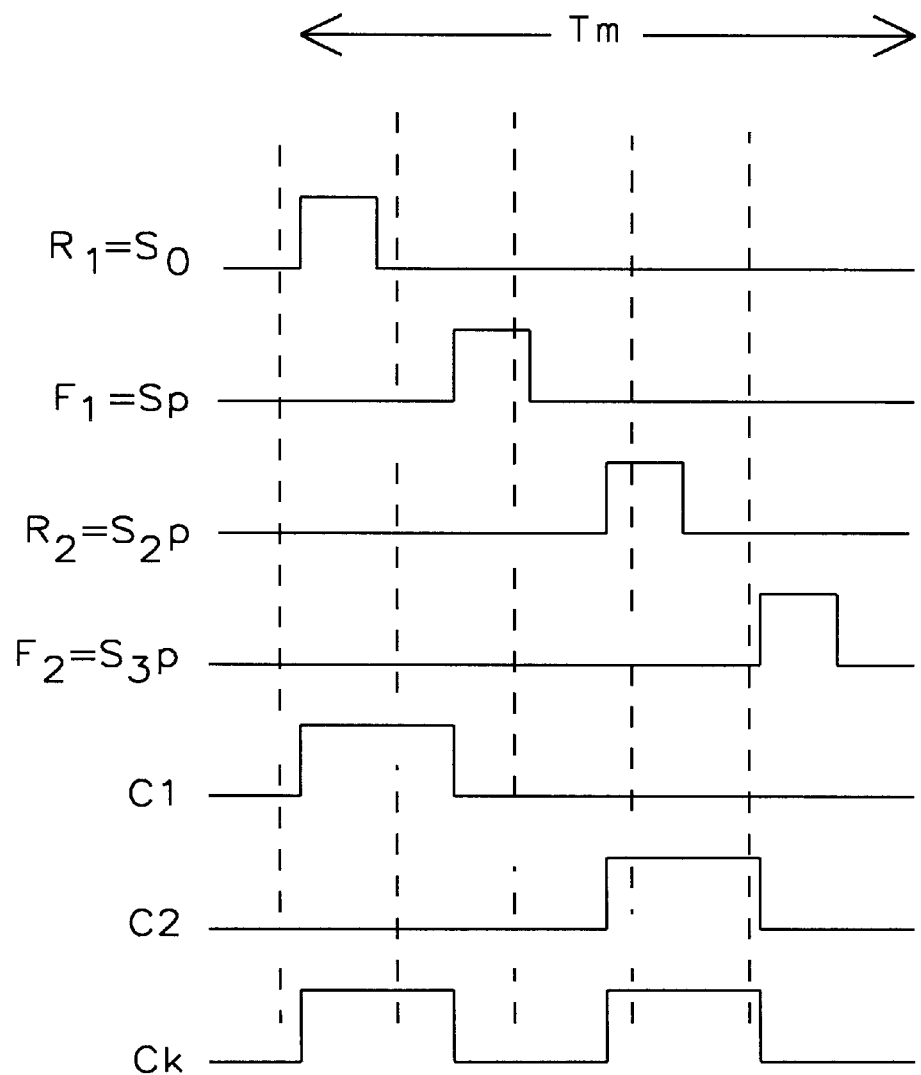
FIGS. 4d and 4e are timing diagrams of the transition selectors and the transition latches of FIG. 4b.

Refer now to FIG. 4d to review the timing of the above-described circuit to generate the clock CK. The selected outputs R1, F1, R2, and F2 of the multiplexers MUXR1, MUXF1, MUXR2, and MUXF2 will respectively have selected the delayed timing signals $S_0$, $S_P$, $S_{2P}$, and $S_{3P}$ according to the selector code C<m−1:0>=0. The rising edge of the output R1 of the multiplexer MUXR1 will cause the preliminary timing signal C1 to transit from a logical 0 to a logical 1. The rising edge of the output F1 of the multiplexer MUXF1 will cause the preliminary timing signal C1 to transit from a logical 1 to a logical 0. The rising edge of the output R2 of the multiplexer MUXR2 will cause the preliminary timing signal C2 to transit from a logical 0 to a logical 1. The rising edge of the output F2 of the multiplexer MUXF2 will cause the preliminary timing signal C2 to transit from a logical 1 to a logical 0.

The preliminary timing signals C1 and C2 will each have a duty cycle that is 25%. When logically combined to form the clock CK, the preliminary timing signals C1 and C2 will force the clock CK to a have a duty cycle of 50%.

Returning now back to FIG. 4b. The clock DCK will have rising and falling edges that are delayed respectively from the rising and falling edges of the clock CK. The delays between the rising edges of the clock DCK and the falling edges of the clock DCK may be different thus effectively changing the duty cycle of the clock DCK.

The transition selector TRANS SEL2 and the transition latch TRANS LATCH2 will create the clock DCK. The series of the delayed signals $S_0, S_1, S_2, \ldots, S_P, \ldots, S_{2P-1}$, $S_{2P}, S_{2P+1}, \ldots, S_{3P}, \ldots$, and $S_{4p-1}$ will be the inputs to the transition selector TRANS SEL2. The transition selector TRANS SEL2 will be comprised of the multiplexers MUXDR1, MUXDF1, MUXDR2, and MUXDF2. The selector codes $CR_1$<m−1:0>, $CF_1$<m−1:0>, $CR_2$<m−1:0>, $CF_2$<m−1:0> will select the appropriate delayed waveform $S_0, S_1, S_2, \ldots, S_P, \ldots, S_{2P-1}, S_{2P}, S_{2P+1}, \ldots, S_{3P}, \ldots$, $S_{4p-1}$ to form the rising and falling edges of the clock DCK. The series of delayed signals $S_0$ through $S_{P-1}$ will be the inputs $S_{21}$ to the multiplexer MUXDR1, the delayed signals $S_P$ through $S_{2P-1}$ will be the inputs $S_{22}$ to the multiplexer MUXDF1, the delayed signals $S_{2P}$ through $S_{3P-1}$ will be the inputs $S_{23}$ to the multiplexer MUXDR2, and the delayed signals $S_{3P}$ through $S_{4p-1}$ will be the inputs $S_{24}$ to the multiplexer MUXDF2.

The selected delayed waveforms will respectively form the output signals $DR_1$, $DF_1$, $DR_2$, and $DF_2$ of the multiplexers MUXDR1, MUXDF1, MUXDR2, and MUXDF2. The signal $DR_1$ will indicate the location in time of the first rising edge of the clock DCK. The signal $DF_1$ will indicate the location in time of the first falling edge of the clock DCK. The signal $DR_2$ will indicate the location in time of the second rising edge of the clock DCK. The signal $DF_2$ will indicate the location in time of the second falling edge of the clock DCK.

The output signals $DR_1$, $DF_1$, $DR_2$, and $DF_2$ respectively of the multiplexers MUXDR1, MUXDF1 MUXDR2, and MUXDF2 are the inputs to the transition latch TRANS LATCH2. The transition latch TRANS LATCH2 is composed of the edge-triggered set/reset flip-flops L3 and L4. The set input S of the edge-triggered set/reset flip-flop L3 is the signal $DR_1$ and the reset input R of the edge-triggered set/reset flip-flop L3 is the signal $DF_1$. The set input S of the edge-triggered set/reset flip-flop L4 is the signal $DR_2$ and the reset input R of the edge-triggered set/reset flip-flop L4 is the signal $DF_2$.

The rising edge of the signal DR1 will cause the output Q of the edge-triggered set/reset flip-flop L3 to transit from a logical 0 to a logical 1 and the rising edge of the signal DF1 will cause the output Q of the edge-triggered set/reset flip-flop L3 to transit from a logical 1 to a logical 0. The rising edge of the signal DR2 will cause the output Q of the edge-triggered set/reset flip-flop L4 to transit from a logical 0 to a logical 1 and the rising edge of the signal DF2 will cause the output Q of the edge-triggered set/reset flip-flop L4 to transit from a logical 1 to a logical 0.

The output Q of the edge-triggered set/reset flip-flop L3 will be the preliminary timing signal CD1 and the output Q of the edge-triggered set/reset flip-flop L4 will be the preliminary timing signal CD2. The preliminary timing signals CD1 and CD2 will be logically combined by the logic gate (OR) $U_3$ to form the clock DCK.

Figure 4E:
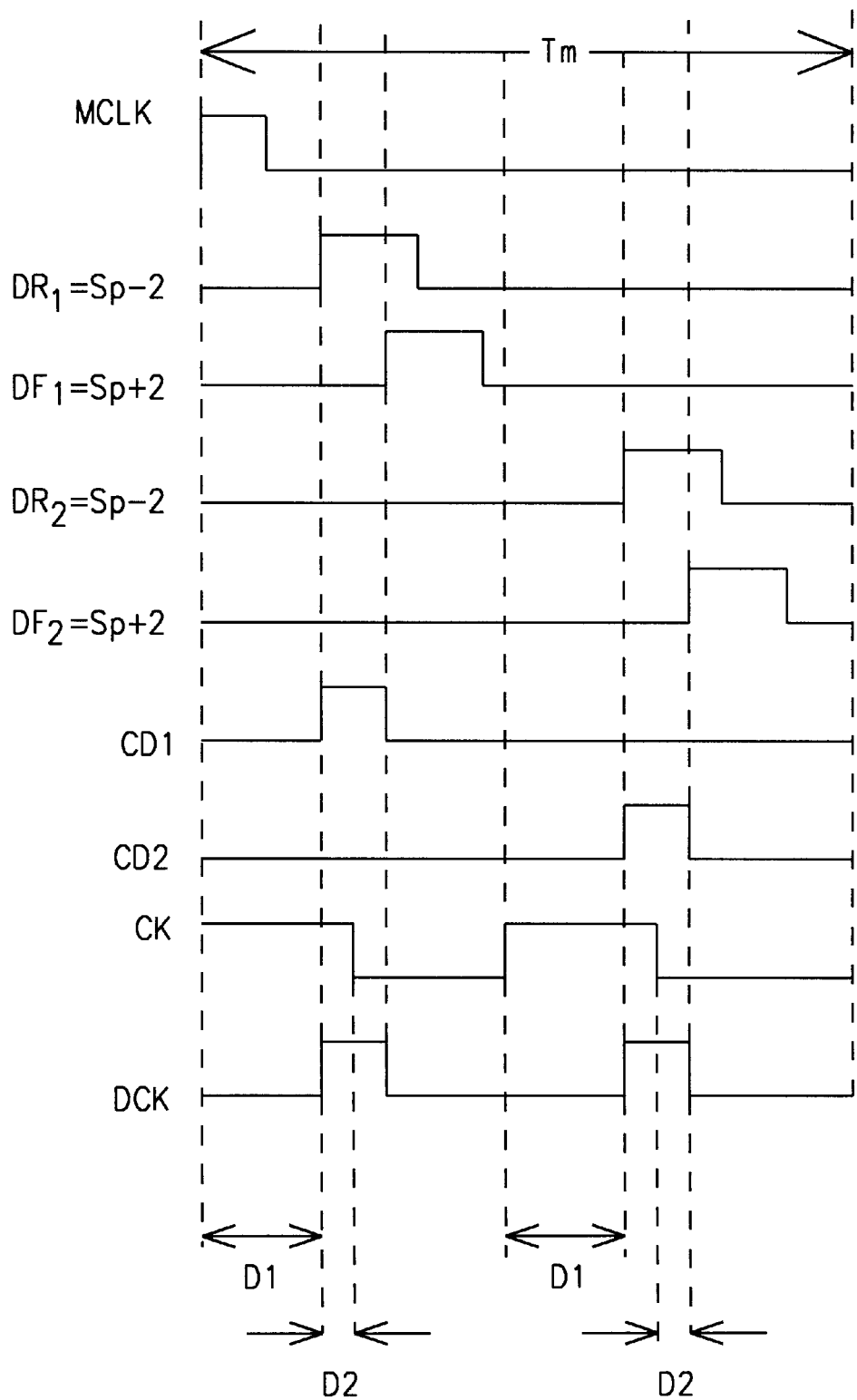

To review the relative timings of the circuit to form the clock DCK, refer now to FIG. 4e. The master clock CLK will have a period $T_m$ as above described. The selected delay signals, in this example, $S_{P-1}$, $S_{P+2}$, $S_{3P-2}$, and $S_{3P+2}$ are respectively the signals $DR_1$, $DF_1$, $DR_2$, and $DF_2$. The rising edge of the signal DR1 will cause the preliminary timing signal CD1 to transit from a logical 0 to a logical 1. The rising edge of the signal DF1 will cause the preliminary timing signal CD1 to transit from a logical 1 to a logical 0. The rising edge of the signal DR2 will cause the preliminary timing signal CD2 to transit from a logical 0 to a logical 1. The rising edge of the signal DF2 will cause the preliminary timing signal CD2 to transit from a logical 1 to a logical 0.

The preliminary timing signals CD1 and CD2 will be combined to form the clock DCK. The delayed waveforms $S_{P-1}$, $S_{P+2}$, $S_{3P-2}$, and $S_{3P+2}$ are chosen such that the rising edges of the clock DCK will be delayed by a delay factor $D_1$ from the rising edges of the clock CK and the falling edges of the clock DCK will be delayed by the delay factor $D_2$ from the falling edges of the clock CK.

It will be apparent to one skilled in the art that appropriate changes in the edge triggering of the edge-triggered set/reset flip-flop and choices of the output levels of the outputs of the transitional latches can change the phasing of the clocks and still be adhering to the concepts of this invention. For instance, the relevant edge of the master clock MCLK may be the falling edge (a transition from a logical 1 to a logical 0) and the trigger edge of the edge-triggered set/reset flip-flop may also be the falling edge. The outputs of the edge-triggered set/reset flip-flop may be the inverse output $\overline{Q}$ to invert the clock phases of the synthesized clock $SYNCLK_n$ of FIG. 3. Further, other logical combinations other than the logical OR of the logic gate U1 of FIG. 3 may be employed to create other timing signals.

Figure 5A:
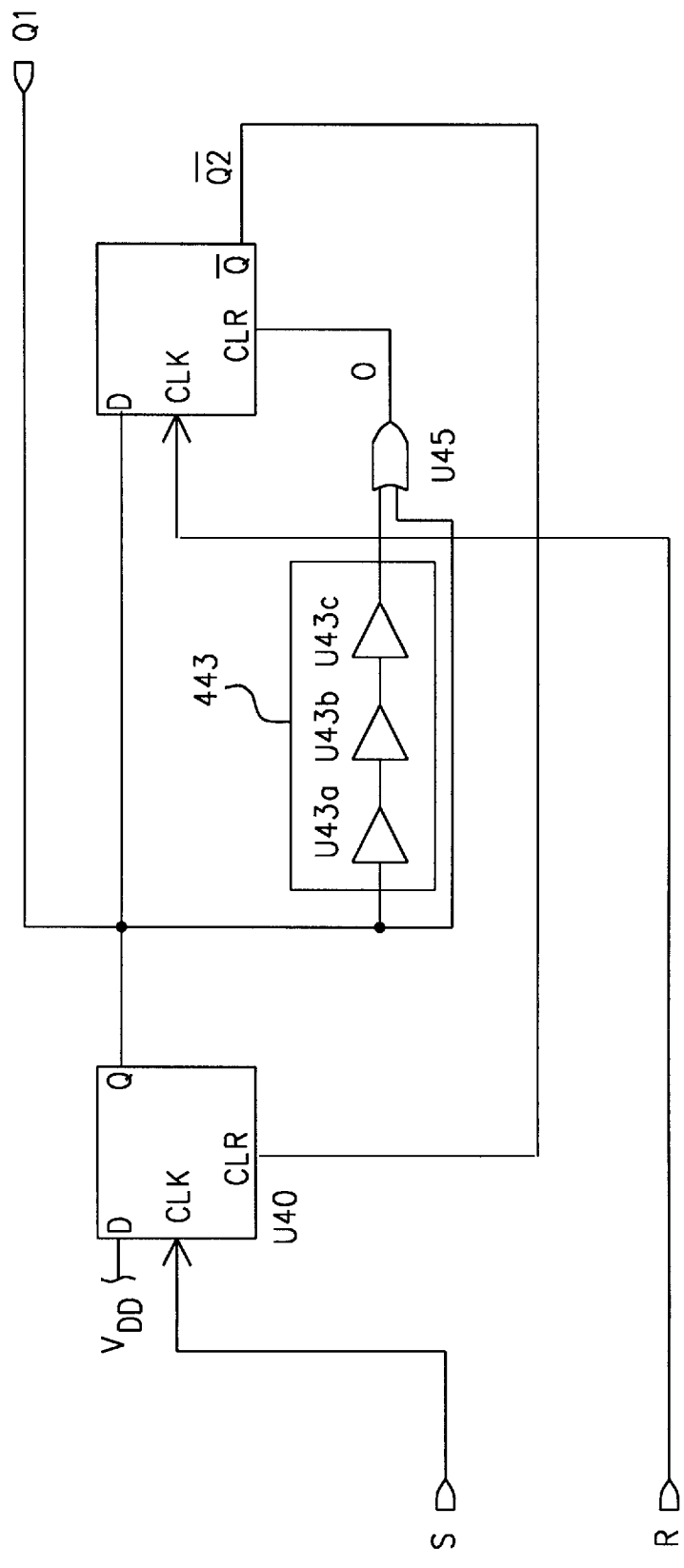
FIG. 5a is a schematic diagram of the edge-triggered set/reset flip-flop of this invention.

The edge-triggered set/reset flip-flop of this invention is described in FIG. 5a. The D-type latch U40 has a clock input CLK that is connected to the set terminal of the edge-triggered set/reset flipflop. The data input D of the D-type latch U40 is connected to the power supply voltage source $V_{cc}$ to provide a logical 1 as the input data. The noninverting output Q of the D-type latch U40 is connected to the data input D of the D-type latch U41, the input of the delay block U43, and the second input of the logic gate U45. The logic gate U45 will perform a logical OR function. The output of the delay block U43 is connected to the first input of the logic gate U45. The reset terminal R is connected to the clock input CLK of the D-type latch U41. The output of the logic gate U45 is connected to the clear CLR of the D-type latch U41. The inverting output $\overline{Q}$ of the D-type latch U41 is connected to the clear input CLR of the D-type latch U40.

The structure and operation of a D-type latch is fundamental and well known in the art. The function of the clear input CLR of the D-type latches U40 and U41 will respectively force the noninverting output Q of the D-type latch U40 to a logical 0 and the inverting output $\overline{Q}$ of the D-type latch U41 to a logical 1.

Figure 5B:
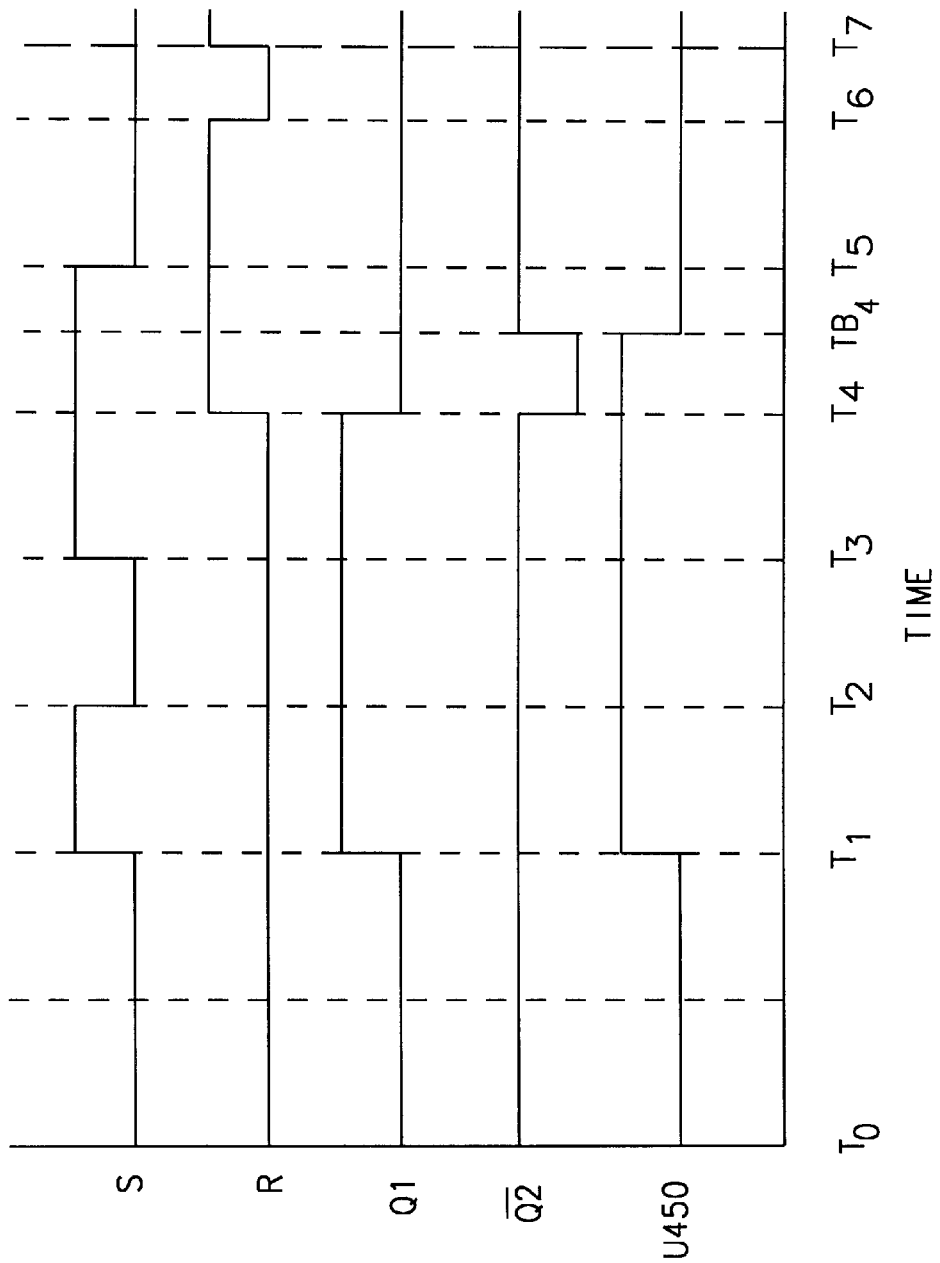

To understand the operation of an edge-triggered set/reset flip-flop of this invention refer now also to FIG. 5b. At time $T_0$, the edge-triggered set/reset flip-flop is activated and the set terminal S and the reset terminal R are placed at a logical 0. The output of the D-type latch U45O and thus the output terminal $Q_1$ will be forced to a logical 0. The inverting output $\overline{Q}_2$ of the D-type latch U41 will be forced to a logical 1 and the output of the logic gate U45 will have an output U45O that is a logical 0. Holding the output U45O of the logic gate U45 at a logical 0 will force the inverting output $\overline{Q}_2$ of the D-type latch U41 to be a logical 1.

At time $T_1$, the set terminal S is brought to a logical 1. The rising edge of the signal at the set terminal S will force the noninverting output $Q_1$ of the D-type latch U540 to a logical 1. The output U45O of the logic gate U45 will nearly instantaneously transit to a logical 1.

At times $T_2$ and $T_3$, the set terminal S will be switched between a logical 1 and a logical 0 and between a logical 0 and a logical 1 with no effect on the output terminal $Q_1$. This indicates the first rising edge of the signal at the set terminal S will set the output terminal $Q_1$.

At time $T_4$, the reset terminal R is brought to a logical 1. Since the noninverting output $Q_1$ is a logical 1 at the arrival of the rising edge of the signal at the reset terminal R, the inverting output $\overline{Q}_2$ of the D-type latch U41 is forced to a logical 0. The inverting output $\overline{Q}_2$ of the D-type latch U41 transiting to a logical 0 will force the noninverting output $Q_1$ of the D-type latch U40 to a logical 0. The output of the delay block will remain at a logical 1 for a delay that is the sum of the circuit delays of the buffer circuits U43a, U43b, and U43c. This will cause the output U45O of the logic gate U45 to remain at a logic 1 until time $T_{4b}$. At time $T_{4b}$, the inverting output $\overline{Q}_2$ of the D-type latch U41 will transit from a logical 0 to a logical 1.

At times $T_6$ and $T_7$, the reset terminal R will be switched between a logical 1 and a logical 0 and between a logical 0 and a logical 1 respectively. This illustrates that the first rising edge of the signal at the reset terminal R will reset the output terminal $Q_1$ to a logical 0 upon arrival of the first rising edge of the signal at the reset terminal R and subsequent changes at the reset terminal R will have not effect on the output terminal $Q_1$.

It will be apparent to those skilled in the art, that appropriate modifications to have negative edge triggering of the edge-triggered set/reset flip-flop, to have reversed sensing of the logic states to provide negative logic, and an inversion of the output signal $Q_1$ are all in keeping with the intent of this invention.

While this invention has been particularly shown and described with reference to the preferred embodiments thereof, it will be understood by those skilled in the art that various changes in form and details may be made without departing from the spirit and scope of the invention.

The invention claimed is:

1. A clocked waveform synthesizer to provide a plurality of synthesized clock waveforms, whereby each clock waveforms has a first transition and a second transition between a first logic level and a second logic level that is relatively delayed from a beginning of a fundamental waveform and each clock waveform is a multiplying factor n of a frequency of the fundamental waveform, comprising:

a multi-tapped delay line having an input to receive the fundamental waveform and generate a plurality of delay signals, whereby each delay signal is incrementally, increasingly delayed from the fundamental waveform;

a plurality of multiplexers, wherein each multiplexer has an input port to receive a fraction of the plurality of delay signals, a select port to receive a select signal to choose one delay signal of the fraction of the plurality of delay signals, and an output port to transmit the one selected delay signal;

a plurality of edge-triggered set/reset flip-flops, whereby each edge-triggered set/reset flip-flop coupled to a respective pair of said plurality of multiplexers, wherein a set terminal of each flip-flop is connected to the output port of a first multiplexer of the respective pair to receive one of the selected delay signals, a reset terminal is connected to the output port of a second multiplexer of the respective pair to receive the one selected delay signal of the second multiplexer, and an output terminal which is for providing a signal changing from said first logic level to said second logic level when the one selected delay signal of the one multiplexer is received at the set terminal and changes from the second logic level to the first logic level when the one selected delay signal of the second multiplexer is received at the reset terminal; and a combining logic gate having a plurality of input terminals each connected to the output terminal of each of the edge-triggered set/reset flip-flops, such that the first and second transitions between the first logic level and the second logic level are determined by the select signals at the select port of the plurality of multiplexers, whereby a first select signal of the select signals determines a first delay factor and a second select signal determines a second delay factor such that a difference in the first and second delay factors determines a relative delay of the first and second transitions of the synthesized clock waveform from the beginning of the fundamental waveform.

2. The clock waveform synthesizer of claim 1 wherein a number of the plurality of delay signals is determined by the formula:

$$S = 2^{m+1} \times n$$

where:

S is a the number of the plurality of delay signals, m is a number of binary digits of the select signal, and n is the multiplying factor of the frequency of the fundamental waveform.

3. The waveform synthesizer of claim 1 wherein an increment of time between each delay signal is determined by the formula:

$$\Delta T = \frac{T_m}{2nP}$$

where:

$\Delta T$ is the increment between each delay signal, $T_m$ is the period of the fundamental waveform, n is the multiplying factor of the frequency of the fundamental waveform, P is a number of increments of the select signal indicating which of the series of delayed signals is to be chosen.

4. The waveform synthesizer of claim 1 wherein the number increments of the select signal is determined by the formula:

$$P=2^m$$

where:

P is the number increments of the select signal, and m is the number of binary digits of the select signal.

5. The waveform synthesizer of claim 1 wherein a number of multiplexers is twice the multiplying factor n of the frequency of the fundamental waveform.

6. The waveform synthesizer of claim 1 wherein the fraction of the plurality of delay signals is determined by the formula:

$$F = \frac{S}{2n} = 2^m$$

where:

F is the fraction of the plurality of delay signals,

S is a total number of the plurality of delay signals, m is the number of binary digits of the select signal, and n is the multiplying factor of the frequency of the fundamental waveform.

7. The waveform synthesizer of claim 1 wherein a number of the plurality of edge-triggered set/reset flip-flops is equal to the multiplying factor n of the frequency of the fundamental waveform.

8. The waveform synthesizer of claim 1 wherein the first delay factor is determined by the formula:

$$TDR_i = \Delta T \cdot |CR_i\langle m-1:0\rangle| = \frac{T_m}{2nP} \cdot |CR_i\langle m-1:0\rangle|$$

where:

$TDR_i$ is the first delay factor, $\Delta T$ is the increment of time between each of the delay signals, and $|CR_i\langle m-1:0\rangle|$ is a decimal equivalent of the first select signal.

9. The waveform synthesizer of claim 1 wherein the second delay factor is determined by the formula:

$$TDF_i = \Delta T \cdot |CF_i\langle m-1:0\rangle| = \frac{T_m}{2nP} \cdot |CF_i\langle m-1:0\rangle|$$

where:

$TDF_i$ is the first delay factor, $\Delta T$ is the increment of time between each of the delay signals, and $|CF_i\langle m-1:0\rangle|$ is a decimal equivalent of the second select signal.

10. The waveform synthesizer of claim 1 wherein the edge-triggered set/reset flip-flop comprises:

a first type latch having a data input connected to a power supply voltage source, a clock input connected to the set terminal, a clear input, and a noninverting output port connected to the output terminal;

a second type latch having a data input connected to the noninverting output port, a clock input connected to the reset terminal, a clear input, and an inverting output port connected to the clear input of the first type latch;

a logic control circuit having an input connected to the noninverting output of the first type latch, and an output connected to the clear input of the second type latch.

11. A waveform synthesizer connected to a master frequency source to generate a first output signal having a frequency that is double a frequency of the master frequency source, a second output signal having a first transition selectively delayed from a first transition of the first output signal and a second transition selectively delayed from a second transition of the first output signals, comprising a multi-tapped delay line having an input connected to the master frequency source, a plurality of outputs, whereby each output is increasingly incrementally delayed from the master frequency source;

a first set of four multiplexers, whereby each multiplexer has an input port to receive one eighth of the plurality of outputs of the multi-tapped delay line, a select port to select one output of the one eighth of the plurality of outputs of the multi-tapped delay line, and an output port to provide the selected one output;

a first edge-triggered set/reset flip-flop having a set input connected to the output port of a first multiplexer of the first set of four multiplexers, a reset input connected to a second multiplexer of the first set of four multiplexers, and an output port that changes from a first logic level to a second logic level when the selected one output of the first multiplexer of the first set of multiplexers is asserted and changes from the second logic level to the first logic level when the selected one output of the second multiplexer of the first set of multiplexers is asserted;

a second edge-triggered set/reset flip-flop having a set input connected to the output port of a third multiplexer of the first set of four multiplexers, a reset input connected to a fourth multiplexer of the first set of four multiplexers, and an output port that changes from a first logic level to a second logic level when the selected one output of the third multiplexer of the first set of multiplexers is asserted and changes from the second logic level to the first logic level when the selected one output of the fourth multiplexer of the first set of multiplexers is asserted;

a first logic combining logic gate having inputs connected to the outputs of the first and second edge-triggered set/reset flip-flops and an output that provides the first output signal to external circuitry;

a second set of four multiplexers, whereby each multiplexer has an input port to receive another eighth of the plurality of outputs of the multi-tapped delay line, a select port to select one output of the one eighth of the plurality of outputs of the multi-tapped delay line, and an output port to provide the selected one output;

a third edge-triggered set/reset flip-flop having a set input connected to the output port of a first multiplexer of the second set of four multiplexers, a reset input connected to a second multiplexer of the second set of four multiplexers, and an output port that changes from a first logic level to a second logic level when the selected one output of the first multiplexer of the second set of four multiplexers is asserted and changes from the second logic level to the first logic level when the selected one output of the second multiplexer of the second set of four multiplexers is asserted;

a fourth edge-triggered set/reset flip-flop having a set input connected to the output port of a third multiplexer of the second set of four multiplexers, a reset input connected to a fourth multiplexer of the second set of four multiplexers, and an output port that changes from a first logic level to a second logic level when the selected one output of the third multiplexer of the second set of four multiplexers is asserted and changes from the second logic level to the first logic level when the selected one output of the fourth multiplexer of the second set of multiplexers is asserted;

a second logic combining logic gate having inputs connected to the outputs of the third and fourth edge-triggered set/reset flip-flops and an output that will transmit the second output signal.

12. The clock waveform synthesizer of claim 11 wherein a number of the plurality of delay signals is determined by the formula:

$$S=2^{m+1}\times 2$$

where:

S is a the number of the plurality of delay signals, and m is a number of binary digits of the select signal.

13. The waveform synthesizer of claim 11 wherein the edge-triggered set/reset flip-flop is comprising:

a first data latch having a data input connected to a power supply voltage source, a clock input connected to the set terminal, a clear input, and a noninverting output port connected to the output terminal;

a second data latch having a data input connected to the noninverting output port, a clock input connected to the reset terminal, a clear input, and an inverting output port connected to the clear input of the first data latch;

a logic control circuit having an input connected to the noninverting output of the first data latch, and an output connected to the clear input of the second data latch.

14. A method to synthesize a clock waveform from a master clock waveform, whereby said clock waveform is a multiple of a frequency of the master clock waveform and has a plurality of transitions that are selectively delayed from a beginning time of a period of said master clock waveform, comprising the steps of:

generating multiple delay signals that are increasingly incrementally delayed from the master clock waveform;

selecting the multiple delayed signals from said multiple delay signal to determine a location in time of each of the plurality of transitions such that each of the plurality of the multiple delayed signal has an aligning transition to align each transition of the plurality of transitions as selected;

generating said a plurality of preliminary clock waveforms by setting and resetting edge-triggered set/reset flip-flops at appropriate locations in time of the plurality of transitions of said clock waveform; and logically combining said plurality of preliminary clock waveforms to form said clock waveform.

15. The method of claim 14 wherein a number of the multiple delay signals is determined by the formula:

$$S=2^{m+1}\times n$$

where:

S is a the number of the multiple delay signals, m is a number of binary digits of the select code used for selecting the plurality of the multiple delay signals, and n is a multiplying factor of a frequency of the master clock waveform.

16. The method of claim 14 wherein the plurality of edge-triggered set/reset flip-flops is equal to the multiplying n of the frequency of the master clock waveform.

17. The method of claim 14 wherein an increment of time between each delay signal is determined by the formula:

$$\Delta T = \frac{T_m}{2nP}$$

where:

$\Delta T$ is the increment between each delay signal, $T_m$ is the period of the fundamental waveform, n is the multiplying factor of the frequency of the master clock waveform, P is a number of increments of the select signal indicating which of the series of delayed signals is to be chosen.

18. The method of claim 14 wherein the number increments of the select signal is determined by the formula:

$$P=2^m$$

where:

P is the number increments of the select signal, and m is the number of binary digits of the select signal.

19. The method of claim 14 wherein a delay of a first of the transitions determined by the formula:

$$TDR_i = \Delta T \cdot |CR_i\langle m-1:0\rangle| = \frac{T_m}{2nP} \cdot |CR_i\langle m-1:0\rangle|$$

where:

$TDR_i$ is the delay of the first of the transitions, $\Delta T$ is an increment of time between each of the multiple delay signals, and $|CR_i{<}m{-}1{:}0{>}|$ is a decimal equivalent of a first select code.

20. The method of claim 14 delay of a second of the transitions determined by the formula:

$$TDF_i = \Delta T \cdot |CF_i\langle m-1:0\rangle| = \frac{T_m}{2nP} \cdot |CF_i\langle m-1:0\rangle|$$

where:

$TDF_i$ is the delay of the second of the transitions, $\Delta T$ is an increment of time between each of the multiple delay signals, and $|CF_i{<}m{-}1{:}0{>}|$ is a decimal equivalent of a second select signal.

21. The method of claim 14 wherein the edge-triggered set/reset flip-flop comprises:

a first data latch having a data input connected to a power supply voltage source, a clock input connected to the set terminal, a clear input, and a noninverting output port connected to the output terminal;

a second data latch having a data input connected to the noninverting output port, a clock input connected to the reset terminal, a clear input, and an inverting output port connected to the clear input of the first data latch;

a logic control circuit having an input connected to the noninverting output of the first data latch, and an output connected to the clear input of the second data latch.

22. An edge-triggered set/reset flip-flop comprising:

a set terminal to receive a set signal having a set transition from a first logic level to a second logic level;

a reset terminal to receive a reset signal having a reset transition from the first logic level to the second logic level;

a output terminal which changes from the first logic level to the second logic level upon receiving the set transition and changes from the second logic level to a first logic level upon receiving the reset transition;

a first data latch having a data input connected to a power supply voltage source, a clock input connected to the set terminal, a clear input, and a noninverting output port connected to the output terminal;

a second data latch having a data input connected to the noninverting output port, a clock input connected to the reset terminal, a clear input, and an inverting output port connected to the clear input of the first data latch; and a logic control circuit having an input connected to the noninverting output of the first data latch, and an output connected to the clear input of the second data latch.

* * * * *